United States Patent
Scheffer

(10) Patent No.: US 7,207,024 B2
(45) Date of Patent: Apr. 17, 2007

(54) AUTOMATIC INSERTION OF CLOCKED ELEMENTS INTO AN ELECTRONIC DESIGN TO IMPROVE SYSTEM PERFORMANCE

(75) Inventor: Louis K. Scheffer, Campbell, CA (US)

(73) Assignee: Cadence Design Sytems, Inc., San Jose, CA (US)

( * ) Notice: Subject to any disclaimer, the term of this patent is extended or adjusted under 35 U.S.C. 154(b) by 48 days.

(21) Appl. No.: 10/660,986

(22) Filed: Sep. 12, 2003

(65) Prior Publication Data

US 2004/0158806 A1 Aug. 12, 2004

Related U.S. Application Data

(60) Provisional application No. 60/410,515, filed on Sep. 13, 2002.

(51) Int. Cl.
G06F 17/50 (2006.01)
(52) U.S. Cl. ............................. 716/11; 716/2
(58) Field of Classification Search .................... 716/2, 716/8–11; 711/117–118; 713/400–401; 700/229
See application file for complete search history.

(56) References Cited

U.S. PATENT DOCUMENTS

| | | | |
|---|---|---|---|
| 4,630,216 A * | 12/1986 | Tyler et al. ................. | 700/229 |
| 5,175,843 A | 12/1992 | Casavant et al. | |
| 5,911,063 A | 6/1999 | Allen et al. | |
| 6,151,682 A * | 11/2000 | van der Wal et al. ........ | 713/401 |
| 6,209,119 B1 * | 3/2001 | Fukui ............................ | 716/2 |
| 6,292,926 B1 | 9/2001 | Fukui et al. | |
| 6,415,430 B1 | 7/2002 | Ashar et al. | |
| 6,434,731 B1 | 8/2002 | Brennan et al. | |
| 6,453,454 B1 | 9/2002 | Lee et al. | |
| 6,466,066 B1 * | 10/2002 | Yoshikawa .................. | 327/141 |
| 6,564,363 B1 * | 5/2003 | Dahl et al. .................... | 716/11 |
| 6,609,228 B1 | 8/2003 | Bergeron et al. | |
| 6,631,444 B2 * | 10/2003 | Smits et al. ................. | 711/118 |
| 6,651,224 B1 * | 11/2003 | Sano et al. .................... | 716/2 |
| 6,798,421 B2 * | 9/2004 | Baldwin ..................... | 345/557 |
| 2002/0184600 A1 | 12/2002 | Sachs | |
| 2003/0145264 A1 | 7/2003 | Siegel et al. | |
| 2003/0182634 A1 | 9/2003 | Chang et al. | |
| 2003/0192020 A1 | 10/2003 | Collins | |

OTHER PUBLICATIONS

Chow et al., "EVE: A CAD Tool for Manual Placement and Pipelining Assistance of FPGA Circuits," ACM, Feb. 2002, pp. 85-94.*
"International Technology Roadmap for Semiconductors", 2001.
McInerney, Rory et al., "Methodology for Repeater Insertion Management in the RTL, Layout, Floorplan and Fullchip Timing Databases of Itanium Microprocessor", International Symposium on Physical Design, 2000, pp. 99-104.

(Continued)

Primary Examiner—Vuthe Siek
(74) Attorney, Agent, or Firm—Bingham McCutchen LLP

(57) ABSTRACT

A method of improving a design of an electronic circuit includes generating the design, specifying one or more pipeline locations of the design, modifying the one or more pipeline locations of the design, and communicating the results to a user.

39 Claims, 5 Drawing Sheets

OTHER PUBLICATIONS

Chinnery, D.G. et al., "Closing the Gap between ASIC and Custom: An ASIC Perspective", Proceedings of the Design Automation Conference, Jun. 2000, pp. 637-342.

Carloni, Luca P. et al., "Theory of Latency-Insensitive Design", IEEE Transactions in Computer-Aided Design of Integrated Circuits and Systems, vol. 20, No. 9, Sep. 2001, pp. 1059-1076.

Carloni, Luca P. et al., "Latency Insensitive Protocols", Computer Aided Verification, 11th International Conference, CAV'99, Trento, Italy, Jul. 1999, pp. 123-133.

Carloni, Luca P. et al., A Methodology for Correct-by-Construction Latency Insensitive Design', Proc. ICCAD, San, Jose, CA, Nov. 1999, pp. 309-315.

Lu, Ruibing et al., "Flip-Flop and Repeater Insertion for Early Interconnect Planning", Proceedings of the 2002 Design, Automation and Test in Europe Conference, 2002.

International Search Report dated May 10, 2004.

* cited by examiner

AUTOMATIC INSERTION OF CLOCKED ELEMENTS INTO AN ELECTRONIC DESIGN TO IMPROVE SYSTEM PERFORMANCE

CROSS-REFERENCE TO RELATED APPLICATION

This application claims the benefit of U.S. Prov. No. 60/410,515 filed Sep. 13, 2002, which is incorporated herein by reference in its entirety.

BACKGROUND OF THE INVENTION

As electronic circuit manufacturing processes shrink, the ratio of wire delay to gate delay keeps increasing. An integrated circuit (IC), or chip, has operations where distant parts of the chip communicate with each other. This communication can now take much longer than the clock cycle required for even a relatively complex local operation. To address this issue, designers can run the entire design at the speeds determined by the slowest global interconnect, or run the design at one speed and the global interconnect at a different (slower) speed. Acceptance of the fact that global signals can be clocked more slowly than local signals was used in the design of the previous International Technology Roadmap for Semiconductors (ITRS) roadmaps, which distinguished between local and global clock speeds. This may work for applications that are intended for optimizing high density or low power concerns, but it is not a feasible alternative for high performance designs.

Another alternative is to switch entirely to a latency-insensitive design, including an asynchronous design. However, this has several problems. A latency-insensitive design does not help performance in the case of significant wire delay. Also, the throughput on each operation is slowed down to round-trip transaction speeds, even on operations that could potentially be pipelined. Designs protected by intellectual property (IP) can be re-used to build large chips in a reasonable amount of time. However, most IP is not available in latency insensitive, much less asynchronous, forms. Even if a latency insensitive design works with any combination of delays, some delay combinations may be much faster than others. Designers are unable to determine which combinations have less delay than others, so optimizing the design to reduce latency is a problem.

A third alternative is to pipeline the global interconnect. While this may not affect the latency, it does allow the throughput to increase with clock speed. With this approach, conventional design tools designed for synchronous digital systems can be used. Because clock frequencies are determined by the slowest local operation rather than the interconnect speed, this approach achieves an optimized throughput. Such aggressive pipelining is one of the main reasons that custom designs achieve much higher clock speeds than Application Specific Integrated Circuit (ASIC) designs while using the same process. The gains from this technique can be dramatic.

Even though this technique is highly effective, it is seldom used. The main reason is that pipelining the interconnect changes the cycle level behavior, which requires a large variety of manual rework of the design, for which there is very little tool support. Inserting clocked elements into a design is difficult and time consuming, because only some locations of the design are legal for this operation. Automatic tools, such as placers and synthesis tools, are unable to determine locations where the designer could insert clocked elements. Furthermore, the impact of inserting clocked elements into the design is difficult for tools to determine. For example, there are no tools that attempt to optimize the placement and potential insertion of clocked elements. The results of any insertion decisions should be communicated to the designer and other tools, however, no tools currently exist to automate this process.

Theoretically, then, design roadmaps could assume that designers will use interconnect pipelining to estimate an achievable clock speed for a microprocessing unit (MPU), but they fail to provide a practical method of automatically performing the pipelining during the design process. The effects of placing clocked elements to form a pipeline are therefore investigated manually. To insert, change, or delete clocked elements such as flip-flops, a designer searches through the design to perform these functions by hand. For example, a designer inserts clocked elements, such as flip-flops, by hand in the RTL design. If the designer wants to compare several possible schemes, each scheme is coded by hand before the comparison. As the design becomes firmer, some clocked elements may be identified as unnecessary, and the designer removes the unnecessary clocked elements by hand.

Consequently, designers seldom use interconnect pipelining at all because of the logistical difficulty of using conventional methods. For example, users rarely try different pipeline schemes since adding or deleting the flip-flops by hand is too hard. Likewise, during process migration or re-design, the clocked elements are seldom changed.

SUMMARY OF THE INVENTION

Methods for inserting clocked elements into electronic designs to improve their performance provide a way to indicate where clocked elements might be inserted, and the cost of doing so. A placer, or a synthesis tool incorporating a placer, can then decide which of these locations should be used, and how many clocked elements should be inserted at each location, in order to either make the design feasible or to optimize system performance. The tool can communicate the resulting design to a designer and other tools.

DETAILED DESCRIPTION

To perform interconnect pipelining, either the user or an appropriate computer-implemented process specifies, to an automated tool, where it is possible to insert clocked elements such as flip-flops or latches, and specifies the impact of using each possible location. With this information, and in combination with the design's physical layout, the automated tool can choose which signals may benefit from additional stages. After insertion, information about inserted clocked elements are communicated to the designers and other tools in the design flow.

To create the pipeline, the impact of pipelining a given signal is considered. The signal's impact may vary greatly, depending on the importance of that signal to the overall system performance. For some signals, pipelining may adversely affect system performance. Avoiding pipelining may be a default mode for one or more signals, and can remain true where the highest performance is needed. For some signals, pipelining is freely allowable, with no performance penalty. For example, graphics processors can allow arbitrary pipelining, since the exact clock cycle when a video image comes out is generally irrelevant. A portion of an electronic design related to human interaction may also have this characteristic.

Many other signals allow pipelining with varying degrees of performance degradation. For example, a Central Processing Unit (CPU) may have several sub-systems, e.g., integer units, floating point units, and a main memory interface. Extra delay in any of these areas can have different effects on system performance. For example, a delay in the integer path affects a larger percentage of instructions than a delay in the floating point path. Therefore, introducing more delay elements in the floating point path as opposed to the integer path results in a lower amount of delay in the system.

Figure 1:
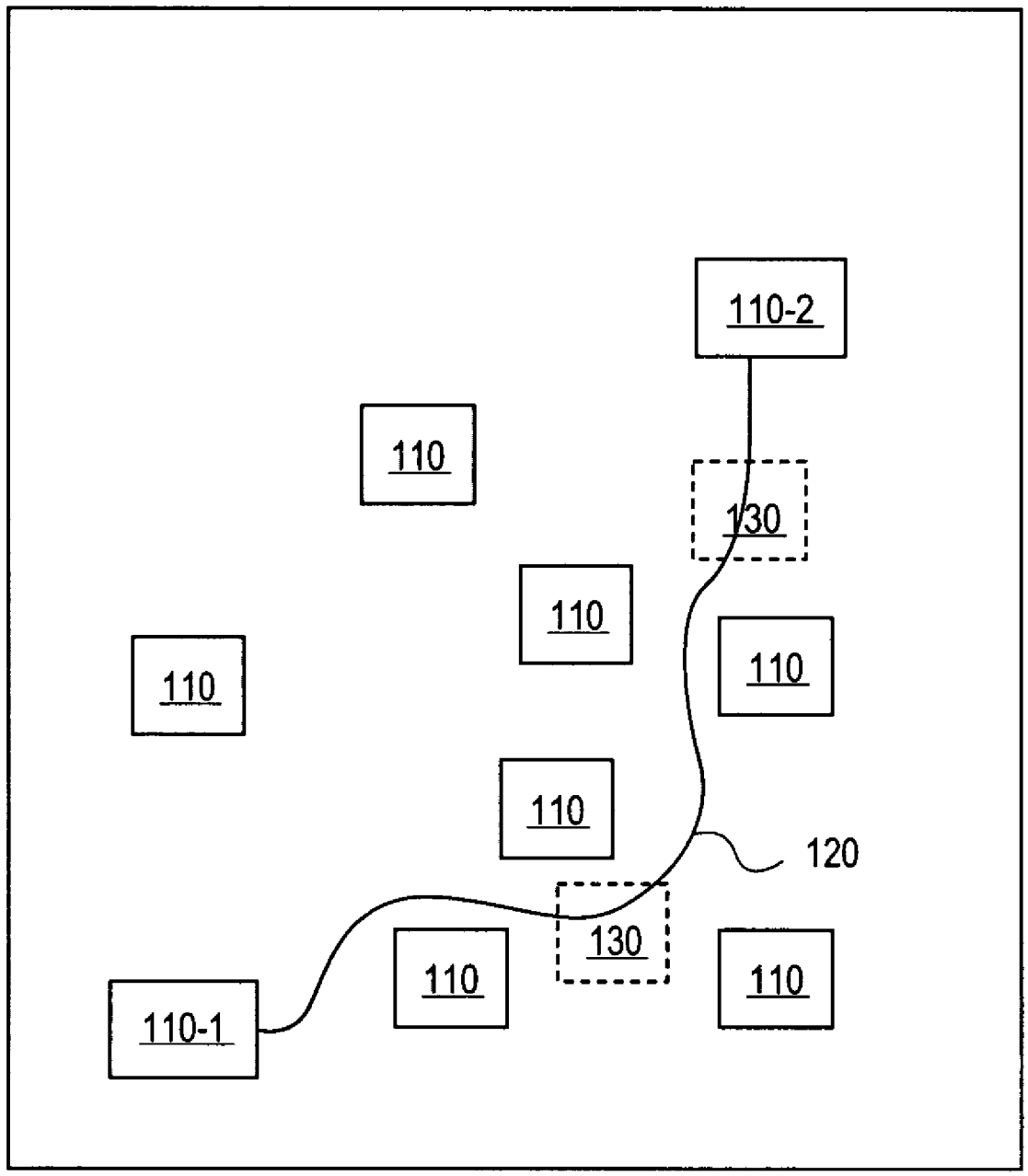
FIG. 1 shows an example of a design modified with clocked elements.
Figure 2:
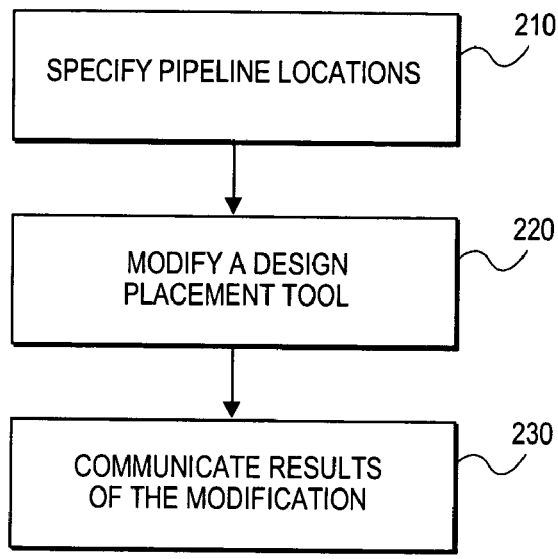
FIG. 2 shows an example of a method of modifying a design with clocked elements.

In one approach, a designer can specify the delay constraints and the objective function. Using these parameters, a placement, floor-planning or synthesis tool can change a design, such as the design of FIG. 1 for example, that may not be physically feasible into one that is by adding pipelining, or alternatively, by trying to maximize the system throughput. Path 120, which connects element 110-1 with element 110-2, is modified to include clocked elements 130 to provide a delay to the signals that travel over the path 120. An example of a method of adding pipelining to optimize system performance, as shown in FIG. 2, includes specifying locations where pipelining is possible 210, modifying a placement tool 220, and communicating results of the modification or optimization 230.

Figure 3:
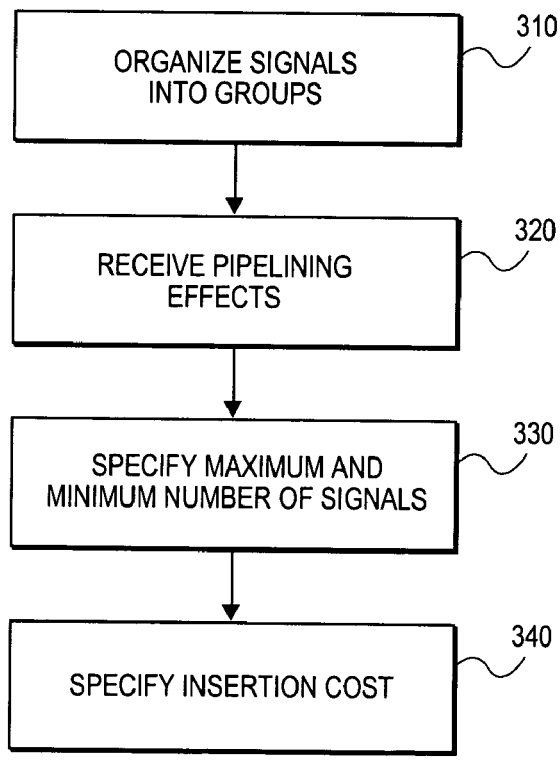
FIG. 3 shows an example of a method of specifying parameters for modifying a design with clocked elements.

Specifying where pipelining is possible may include specifying and storing rules about how to implement the potential pipelining, as shown in FIG. 3. To do this, signals are organized into groups 310. The signals of a group receive the same pipelining effects 320. If a bit of a bus is pipelined, for example, then the other bits should be pipelined, and perhaps some of the controls signals as well. The delayed signals could be modeled as separate delay variables with equality constraints, but in practice they may be inserted and deleted as a group, since any other assignment violates equality constraints. The minimum and maximum number of clocked stages that can be inserted on this delayed signal group are specified 330. Also, a relative cost of insertion (per stage) for this group is specified 340.

Additional parameters may also be addressed. For example, flip-flops to be used can be specified. A design library can have many flip-flops; the user should specify which one to use. The selected clocked element may be determined based on drive strength, reset mechanisms, and whether the flip-flop is edge triggered or latch based. The clock(s) used in the pipelining may also be specified. Gating conditions under which the clocks can be turned off in the interest of power reduction can be specified. For example, if either the source or the destination is disabled, the power expended in a pipelined signal may be reduced. A scan chain, or other test information for inserted flip-flops, may be specified. Other tools, such as verification tools for example, may receive information about how many stages of delay, if any, were inserted in a selected location.

Figure 4:
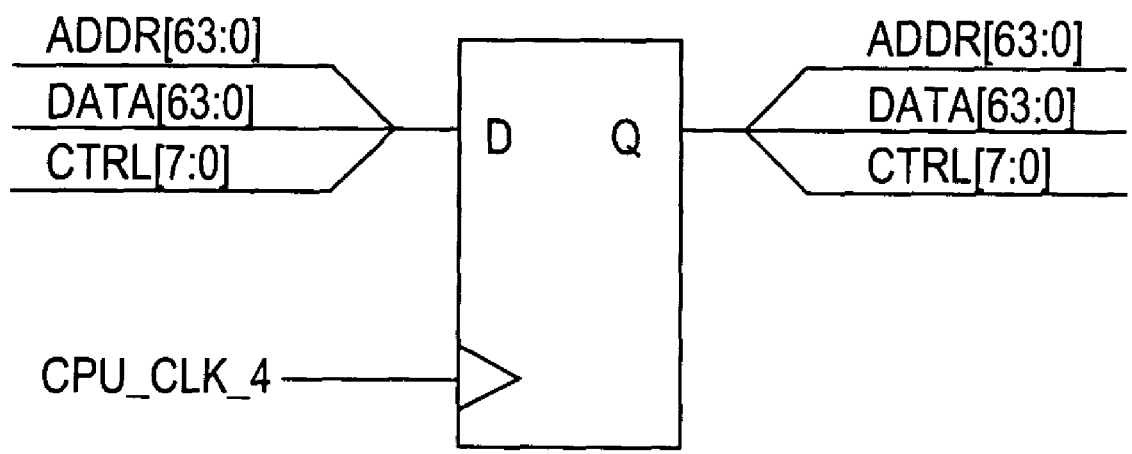
FIG. 4 shows an example of parameters used to modify a design with clocked elements.

An example of how this information could be specified and stored is as groups in modern CAD (Computer Aided Design) database technology such as OpenAccess, which is produced by Cadence Design Systems, Inc., of San Jose, Calif., for example. The groups can have properties that would specify additional pipeline design information, such as the relative cost. Another example of a method to specify and store pipeline information includes inserting specialized components, or pipeline relay stations, as shown in FIG. 4. The specialized components, which identify the places where clocked elements can be inserted, could be described in graphical form as shown in FIG. 4; in text form using electronic design languages such as Verilog, VHDL, SystemC, or Superlog for example; or by a separate side file of an arbitrary format.

The design tool captures the pipeline information shown in FIG. 4, such as, for example, rules to specify that flip-flops are to be inserted (or removed) on each signal of the busses ADDR, DATA and CTRL simultaneously; that the cell to use is ff3; that the clock to use is CPU_CLK_4; that the number of stages ranges between a and b, that the throughput per cycle drops by a factor of 0.9 for each inserted delay, and that the variable D2 tells how many stages were inserted for use by other tools.

Figure 5:
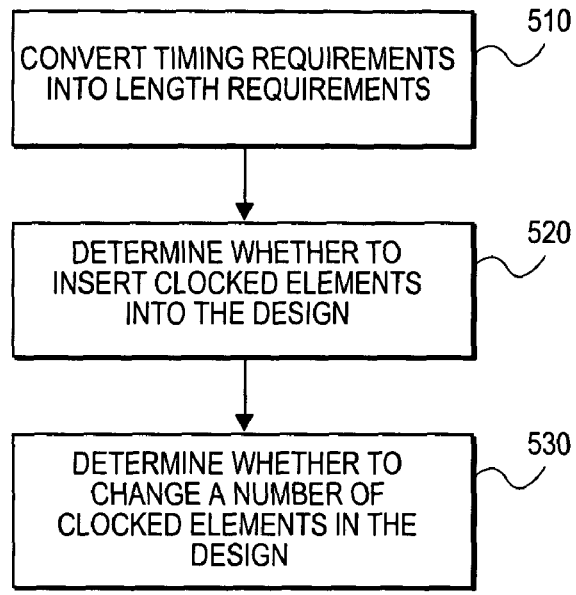
FIG. 5 shows an example of a method of modifying a placement tool to perform a method of modifying a design with clocked elements.

Modifications to the placement (or combined synthesis/placement) tool may be made to allow the existing tool to perform the method of improving system performance by using pipelining as shown in FIG. 5. The placement tool modification may include converting timing requirements into length requirements 510. The modified placement tool can improve a system's performance to meet a specific goal. The automated placer tool can be used to meet a fixed cycle time constraint by inserting clocked elements. The automated placer can optimize throughput by inserting clocked elements into the design. The modified placer may also provide the ability to back annotate pipelining decisions with minimal changes to the RTL source. For example, if a design parameter is a fixed operating frequency of the system, a designer can create a design that satisfies this requirement using pipelining. The modified placer inserts pipeline stages in the interconnect to create a feasible but lower performance solution.

In another example, a goal of the design may be to optimize throughput. In this case, the modified placement tool has an option not considered by conventional placing tools, which is whether to insert clocked elements into the design 520, or if clocked elements are already in the design, whether to change a number of clocked elements in the design, 530. By inserting flip-flops on one or more relatively long paths, the modified placer can reduce the timing constraints on those paths, and thus raise the operating frequency. To determine whether a flip-flop should be inserted or removed, the placer for pipelining considers both the increased frequency and the decreased efficiency per cycle of an insertion or removal, which may be computed from the user-specified throughput figures.

Additional pipelining methods may be used for performing optimization, such as those already used by the placer. From the viewpoint of using pipelining to improve system performance, the placer should consider designs both with and without each clocked element, and choose the more optimal. This can be done in several ways.

For example, an iterative placer could attempt to remove a most restrictive constraint by inserting a clocked element on that signal. Then it can re-solve for the location of the elements in the modified design, and determine if the increased clock compensates for the decreased throughput per cycle. As another example, a simulated annealing placer could perform adding or deleting clocked elements, and add the throughput changes from the additions or deletions to its cost function. A placement method could combine the placement and clocked element insertion effects directly, by representing them as a mixed integer/linear programming problem. Linear variables may be used to represent the placement of the blocks. Integer variables may be used to determine whether a given clocked element should be placed at a given location.

Additional algorithms, and their variants, may also be used for evaluating the different placement possibilities and choosing between them. For example, methods such as quadratic placement, mixed integer/linear programming, or branch and bound could be modified to include considering the effects of adding clocked elements. Any other evaluation method that allows the placer to consider the effects of inserting clocked elements can also be used.

Figure 6:
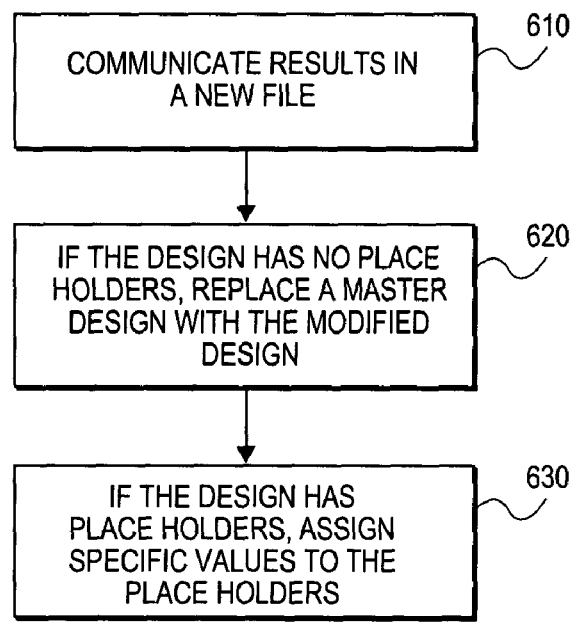
FIG. 6 shows an example of a method of communicating a result of modifying a design with clocked elements.

After an improved or optimized design is generated by pipelining, the results of the optimized design are communicated to other tools or to the user, because the placer (or synthesis/placer) is modifying the design to achieve the improved performance. Several methods may be used to back-annotate results after insertion as shown in FIG. 6. For example, the design program could write a new source file to communicate the results 610, in one of several design languages, which may include options (e.g., hierarchical or flat, preserve formatting or delete it, or whether to include power connections). The results could be simply a report, which may be combined with the original description, or a unified description. This report could be in any one of a number of formats.

If the design was not built with placeholders for the inserted flip-flops, then the master design could be replaced with the modified design with the inserted flip-flops, so that the modified design becomes the new master design 620. To do this, the placer can modify the RTL netlist while preserving user annotations such as indents and comments. For example, a top level design can include interconnect logic such as inserted buffers, flip-flops, and clock trees. Then, a back annotation process changes one or more modules, or a completely new RTL netlist could be written.

If the original design does include placeholders, such as the relay stations described above, then the placeholders are assigned specific values 630, and the original netlist is unchanged. If the input is hierarchical and one cell, used two or more times, is assigned a different delay in each instance, then uniquification, instance specific properties, or avoiding this situation with more complex rules, may be performed.

Designers who seldom use interconnect pipelining because of the logistical difficulty of conventional methods may use the automated pipelining method to more efficiently perform interconnect pipelining. Also, users can try different pipeline schemes, since adding or deleting the flip-flops is performed with an automatic tool that can consider a much larger variety of possible solutions. Likewise, during process migration or re-design, optimizing the clocked elements with the automated process is much easier than with conventional methods.

The modified placer or synthesis/placement tool can determine much better solutions than current tools. For example, in the fixed frequency case, the pipelining placer tool can find feasible solutions where the old tools cannot, since it has the option of inserting pipeline elements to loosen the restrictions on critical paths. In the variable frequency case, the automated pipelining tool can find solutions with much higher throughput, since it can consider the advantages and benefits (e.g., higher clock rate) and disadvantages and costs (e.g., decreased throughput per cycle) of inserting clocked elements.

Pipelining decisions can also be made without changing the master RTL source code for the system design. This permits a much cleaner division of labor between the RTL designer and the layout designer. For example, the RTL designer can indicate where the layout designer can change the design, and the layout designer can make desired changes later, without requiring the RTL designer to change their source code.

With this method and apparatus, a designer can specify where clocked element insertion may be performed. This method and apparatus also allows a designer to specify an amount of design degradation that would result from the insertion of various different clocked elements. In one embodiment, the degradation caused by inserting a given flip-flop is specified as a simple multiplier. Alternatively, a function may be used to describe the system performance degradation as a function of one or more delay variables. The function could also account for interactions between the inserted delays.

The pipelining method may be used for mapping logic designs into Field Programmable Gate Arrays (FPGAs). In these chips, there are generally many unused flip-flops that are available for use in pipelining interconnect. The interconnect in FPGAs may be slow because of the presence of switches along its length, and can benefit from the ability to introduce clocked elements. Also, the performance of FPGAs can be improved with pipelining. The users of FPGAs are generally interested in time to market, and are even less likely than custom chip users to engage in extensive experimentation, so they would appreciate an automatic technique for pipelining.

Figure 7:
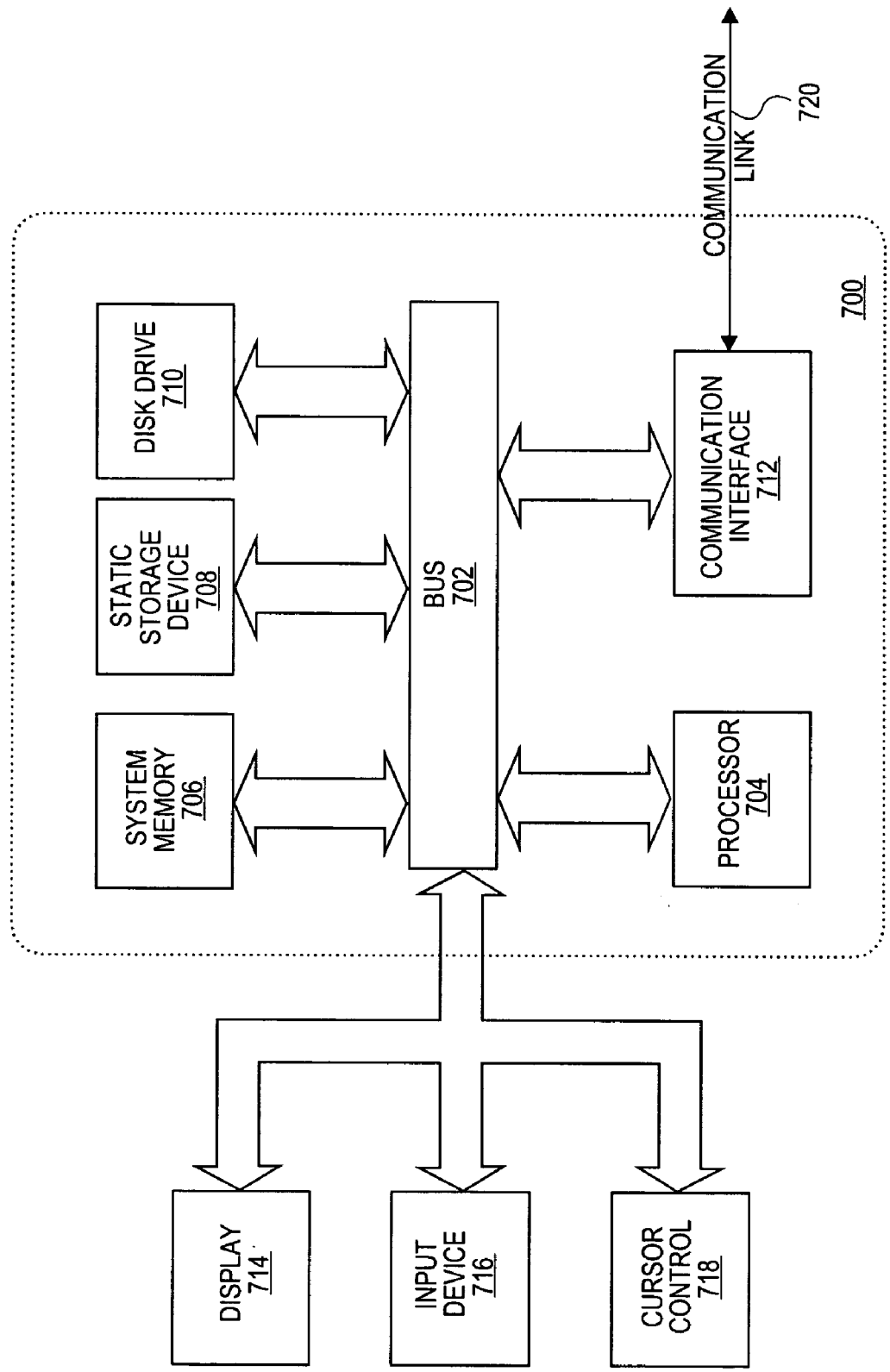
FIG. 7 shows an example of a computer processing system to modify an electronic design with clocked elements.

FIG. 7 is a block diagram of a computer system 700 suitable for implementing an embodiment of a method of inserting clocked elements into a design. Computer system 700 includes a bus 702 or other communication mechanism for communicating information, which interconnects subsystems and devices, such as processor 704, system memory 706 (e.g., RAM), static storage device 708 (e.g., ROM), disk drive 710 (e.g., magnetic or optical), communication interface 712 (e.g., modem or ethernet card), display 714 (e.g., CRT or LCD), input device 716 (e.g., keyboard), and cursor control 718 (e.g., mouse or trackball).

According to one embodiment of automatic insertion of the clocked elements, computer system 700 performs specific operations by processor 704 executing one or more sequences of one or more instructions contained in system memory 706. Such instructions may be read into system memory 706 from another computer readable medium, such as static storage device 708 or disk drive 710. In alternative embodiments, hard-wired circuitry may be used in place of or in combination with software instructions to implement automatic insertion of the clocked elements into a circuit design.

The term "computer readable medium" as used herein refers to any medium that participates in providing instructions to processor 704 for execution. Such a medium may take many forms, including but not limited to, non-volatile media, volatile media, and transmission media. Non-volatile media includes, for example, optical or magnetic disks, such as disk drive 710. Volatile media includes dynamic memory, such as system memory 706. Transmission media includes coaxial cables, copper wire, and fiber optics, including wires that comprise bus 702. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the automatic insertion of the clocked elements, execution of the sequences of instructions to practice automatic insertion of the clocked elements is performed by a single computer system 700. According to other embodiments of the insertion methods, two or more computer systems 700 coupled by communication link 720 (e.g., LAN, PTSN, or wireless network) may perform the sequence of instructions required to practice the insertion methods in coordination with one another.

Computer system 700 may transmit and receive messages, data, and instructions, including program, i.e., application code, through communication link 720 and communication interface 712. Received program code may be executed by processor 704 as it is received, and/or stored in disk drive 710, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense and the invention defined only by the claims.

The invention claimed is:

1. A method of improving a design of an electronic circuit, comprising:
   generating an electronic design;
   automatically specifying one or more pipeline locations of the electronic design;
   determining whether to insert one or more clocked elements at the one or more automatically-specified pipeline locations where a determination is made of whether to avoid inserting one or more clocked elements for at least one of the one or more pipeline locations; and
   based upon results of determining whether to insert the one or more clocked elements, automatically modifying a number of clocked elements in the one or more pipeline locations of the design.

2. The method of claim 1, further comprising:
   organizing signals in the electronic design into groups; and
   specifying rules for pipelining each signal group.

3. The method of claim 1, wherein the clocked element modification is based on one or more parameters of the design addressed by the clocked element modification.

4. The method of claim 3, wherein the one or more parameters comprises an operating frequency and an efficiency per cycle.

5. The method of claim 3, further comprising examining the effects on the one or more parameters, wherein the clock element modification and parameter effect examination is iteratively performed.

6. The method of claim 1, further comprising determining one or more placement locations for one or more of the clocked elements.

7. The method of claim 6, further comprising examining effects of the clock element modification and placement location as a mixed programming problem.

8. The method of claim 1, wherein the design comprises a central processing unit (CPU) in which the one or more pipeline locations are specified.

9. The method of claim 1, wherein the one or more pipeline locations are manually specified.

10. The method of claim 1, wherein the one or more pipeline locations are automatically specified.

11. The method of claim 1, wherein the clocked elements comprise flip-flops.

12. The method of claim 1, wherein the clock element modification comprises inserting at least one clock element at the one or more pipeline locations.

13. The method of claim 1 which is performed within an electronic design tool.

14. An apparatus for improving a design of an electronic circuit comprising:
   means for generating an electronic design;
   means for automatically specifying one or more pipeline locations of the electronic design;
   means for determining whether to insert one or more clocked elements at the one or more automatically-specified pipeline locations where a determination is made of whether to avoid inserting one or more clocked elements for at least one of the one or more pipeline locations; and
   means for automatically modifying a number of clocked elements in the one or more pipeline locations of the design based upon results of determining whether to insert the one or more clocked elements.

15. The apparatus of claim 14, further comprising:
   means for organizing signals in the electronic design into groups; and
   means for specifying rules for pipelining each signal group.

16. The apparatus of claim 14, wherein the clocked element modification is based on one or more parameters of the design addressed by the clocked element modification.

17. The apparatus of claim 16, wherein the one or more parameters comprises an operating frequency and an efficiency per cycle.

18. The apparatus of claim 16, further comprising means for examining the effects on the one or more parameters, wherein the clock element modification and parameter effect examination is iteratively performed.

19. The apparatus of claim 14, further comprising means for determining one or more placement locations for one or more of the clocked elements.

20. The apparatus of claim 19, wherein the clocked element modification means and placement location means comprise the same device.

21. The apparatus of claim 19, further comprising means for examining effects of the clock element modification and placement location as a mixed programming problem.

22. The apparatus of claim 14, wherein the design comprises a central processing unit (CPU) in which the one or more pipeline locations are specified.

23. The apparatus of claim 14, wherein the clock element modification means comprises a computer processor.

24. The apparatus of claim 14, wherein the clocked elements comprise flip-flops.

25. The apparatus of claim 14, wherein the clock element modification comprises means for inserting at least one clock element at the one or more pipeline locations.

26. The apparatus of claim 14 in which the apparatus comprises an electronic design tool.

27. The apparatus of claim 26 in which the electronic design tool comprises a layout tool.

28. An article of manufacture comprising a computer readable medium storing a computer software program which, when executed by a computer processing system, causes the system to perform a method of improving a design of an electronic circuit, the method comprising:
   automatically specifying one or more pipeline locations of the electronic design;
   determining whether to insert one or more clocked elements at the one or more automatically-specified pipeline locations where a determination is made of whether to avoid inserting one or more clocked elements for at least one of the one or more pipeline locations; and
   based upon results of determining whether to insert the one or more clocked elements, automatically modifying a number of clocked elements in the one or more pipeline locations of the design.

29. The article of manufacture of claim 28, wherein the method further comprises:
   organizing signals in the electronic design into groups; and
   specifying rules for pipelining each signal group.

30. The article of manufacture of claim 28, wherein the clocked element modification is based on one or more parameters of the design addressed by the clocked element modification.

31. The article of manufacture of claim 30, wherein the one or more parameters comprises an operating frequency and an efficiency per cycle.

32. The article of manufacture of claim 30, wherein the method further comprises examining the effects on the one or more parameters, wherein the clock element modification and parameter effect examination is iteratively performed.

33. The article of manufacture of claim 28, wherein the method further comprises determining one or more placement locations for one or more of the clocked elements.

34. The article of manufacture of claim 33, wherein the method further comprises examining effects of the clock element modification and placement location as a mixed programming problem.

35. The article of manufacture of claim 28, wherein the design comprises a central processing unit (CPU) in which the one or more pipeline locations are specified.

36. The article of manufacture of claim 28, further comprising an input for receiving the one or more pipeline locations input by a user.

37. The article of manufacture of claim 28, wherein the method further comprises specifying the one or more pipeline locations.

38. The article of manufacture of claim 28, wherein the clocked elements comprise flip-flops.

39. The article of manufacture of claim 28, wherein the clock element modification comprises inserting at least one clock element at the one or more pipeline locations.

* * * * *